United States Patent [19]

DeMeester et al.

[11] Patent Number: 4,851,779

[45] Date of Patent: Jul. 25, 1989

[54] THREE DIMENSIONAL VOLUME IMAGING WITH CONJUGATE SYMMETRIZATION

[75] Inventors: Gordon D. DeMeester, Wickliffe; G. Neil Holland, Chagrin Falls; Francis H. Bearden, Twinsburg, all of Ohio

[73] Assignee: Picker International, Inc., Highland Heights, Ohio

[21] Appl. No.: 157,972

[22] Filed: Feb. 18, 1988

Related U.S. Application Data

[63] Continuation-in-part of Ser. No. 85,956, Aug. 14, 1987, Pat. No. 4,780,675.

[51] Int. Cl.⁴ ............................................. G01R 33/20
[52] U.S. Cl. ................................... 324/312; 324/309
[58] Field of Search ............... 324/307, 309, 312, 318; 364/414

[56] References Cited

U.S. PATENT DOCUMENTS

| | | | |
|---|---|---|---|
| 4,694,251 | 9/1987 | Yoshitome et al. | 324/309 |
| 4,728,893 | 3/1988 | Feinberg | 324/312 |
| 4,767,991 | 8/1988 | Rzedzian | 324/312 |

OTHER PUBLICATIONS

"Faster MR Imaging: Imaging with Half the Data" by Margosian, et al., Health Care Instrumentation, vol. 1, No. 6, 1986, pp. 195-197.
"Faster MR Imaging-Imaging with half the data" by Paul Margosian, Society of Magnetic Resonance in Medicine, 4th Annual Meeting, Aug. 19-23, 1986, London, pp. 1024-1025.
"Field Inhomogeneity Correction and Data Processing for Spectroscopic Imaging" by Maudsley, et al., Magnetic Resonance in Medicine, 2, 1985, pp. 218-233.
"Direct Fourier Transform NMR Tomography with Modified Kumar-Welti-Ernst (MKWE) Method" by Song, et al., IEEE Transactions on Nuclear Science, vol. NS-29, No. 1, Feb. 1982.
"Magnetic field measurement by NMR imaging" by Maudsley, et al., The Institute of Physics, 1982, pp. 216-220.
"A New method of measuring static field distribution using modified Fourier NMR imaging" by Sekihara, et al., The Institute of Physics, 1985, pp. 224-227.
"MR Images from on Quarter of the data: Combination of Half Fourier Methods with a Linear Recursive Data Extrapolation" by P. Margosian, Book of Abstracts, Society of Mag. Res. In Medicine, Annual Meeting, Aug. 1987.
"RARE Imaging: A Fast Imaging Method for Clinical MR" by Henning, et al., Mag. Res. in Medicine, 3, pp. 823-833 (1986).
"Phase Encoded, Rapid, Multiple Echo (PERME) Nuclear Magnetic Resonance Imaging" by Lawton, Aug. 1985.
"Exploiting the Stimulated Echo in NMR Imaging" by Sattin, for NVR, Picker Clinical Science Center, vol. 2, No. 1, Feb. 1987, pp. 18-21.

*Primary Examiner*—Stewart J. Levy
*Assistant Examiner*—Kevin D. O'Shea
*Attorney, Agent, or Firm*—Fay, Sharpe, Beall, Fagan, Minnich & McKee

[57] ABSTRACT

An incomplete set of three dimensional magnetic resonance data is collected and stored in acquired data memory (40). The incomplete data set is complete with respect to first and second directions and incomplete with respect to a third direction. However, the acquired data set has data along the third direction between ±n central values and half the remaining values. One dimensional inverse Fourier transforms (64, 66) are performed with respect to the first and second directions to create an intermediate data set (68). A phase correction array or plurality of phase correction vectors p(r) are generated from the intermediate data and stored in a phase correction memory (82). A symmetric data set (100) is created as the complex conjugate of the intermediate data set. The intermediate and symmetric data sets are one dimensionally inverse Fourier transformed (96, 104) with respect to the third direction one vector at a time to produce vectors of first and second complex image arrays ($f_A$, $f_S$) corrected (96, 108) with the corresponding phase correction vector, and combined (110) into a line of a resultant three dimensional image representation (112).

20 Claims, 4 Drawing Sheets

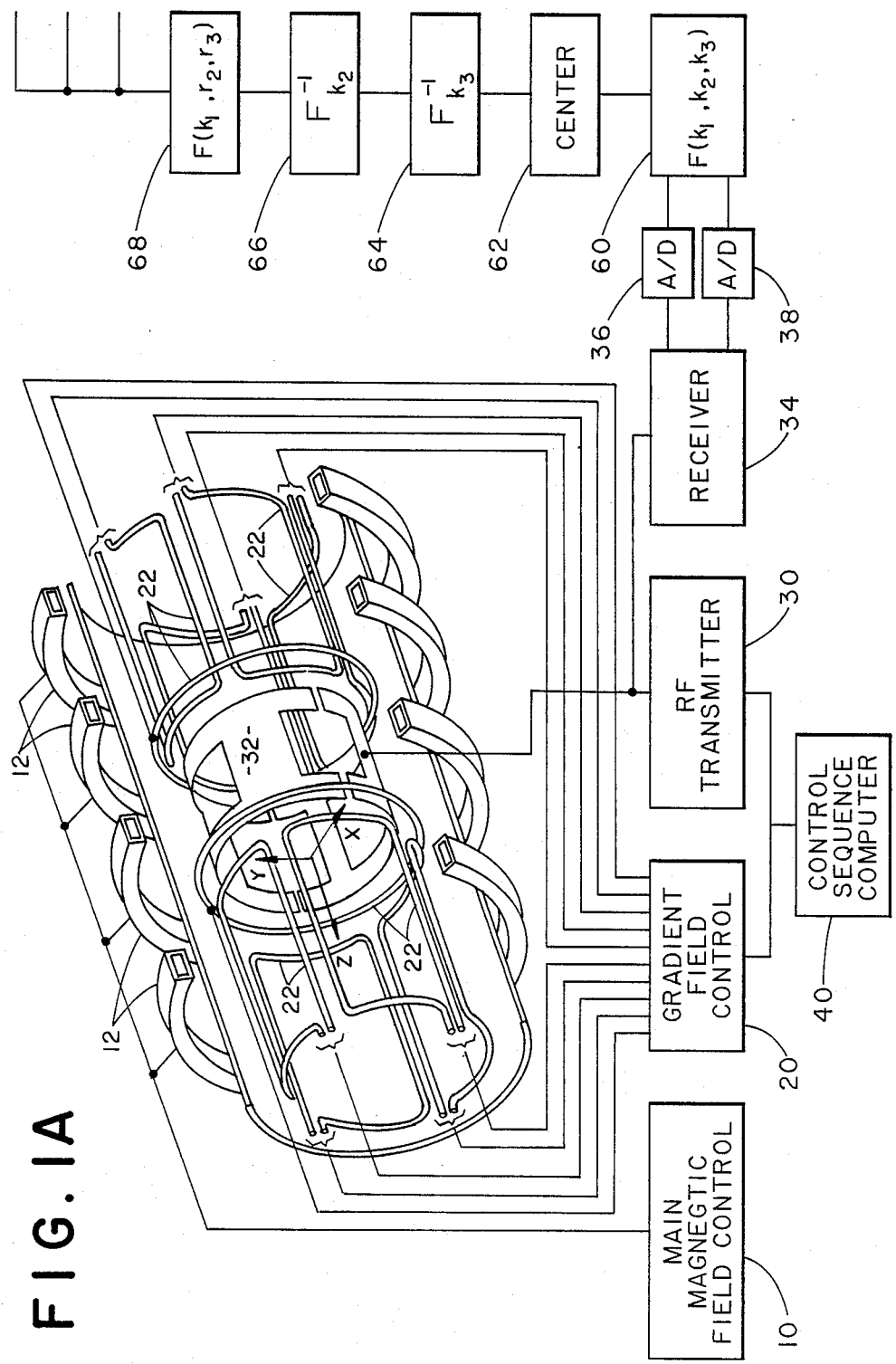

THREE DIMENSIONAL VOLUME IMAGING WITH CONJUGATE SYMMETRIZATION

The present application is a continuation-in-part of U.S. application Ser. No. 085,956, filed Aug. 14, 1987, now U.S. Pat. No. 4,780,675.

BACKGROUND OF THE INVENTION

The present invention relates to the magnetic resonance art. It finds particular application in three dimensional or volumetric imaging and will be described with particular reference thereto, although the benefits may be equally applicable to two or four dimensional imaging. It is to be appreciated, however, that the invention may also find application in other imaging and spectroscopy techniques in which a partial or incomplete data set is reconstructed.

Heretofore, medical diagnostic magnetic resonance imaging has included the sequential pulsing of radio frequency signals and magnetic field gradients throughout an examination region to be imaged. In volumetric or three dimensional imaging, a region of interest of a patient is disposed in a substantially uniform, main magnetic field. An RF excitation pulse is applied to tip at least some of the magnetization aligned with the field into a transverse plane. The RRF excitation may be applied independent of a gradient or concurrently with a slice select gradient. A primary phase encode gradient is applied along one direction and a secondary phase encode gradient is applied along another direction which may also be the slice select gradient direction. In each repetition of the pulse sequence, one of the phase encode gradients is stepped at regular intervals from a negative maximum phase encode gradient, through a zero phase encode gradient, to a positive maximum phase encode gradient. For each gradient step of the first phase encode gradient, the other phase encode gradient is similarly stepped at regular intervals from the negative maximum, through zero, to the positive maximum. Commonly, an RF pulse and/or a gradient field is applied to manipulate the magnetization to cause an ensuing magnetic resonance echo. During the echo, a read gradient is applied along a third direction and echo data is sampled. Typically, the set of data points sampled during an echo is termed a view or step. The complete set of views or steps are operated on with a three dimensional Fourier transform to generate a resultant three dimensional image representation.

Each datum or element of the three dimensional, (3D), or volume data set can be thought of as a sample of a single point in k-space. In this representation, k corresponds to a 3D spatial frequency. Its projection in the phase encode direction caused by the phase encode gradients is equivalent to its projection in the read direction caused by the read gradient. When the sampling of k-space is done in an isotropic manner, each point in the data set is related to another point by the conjugate symmetry relation:

$$F(k) = F^*(-k)$$

In practice, this symmetry relationship is subverted by unpredictable phase variations that result from sequence and magnetic field considerations. Thus, conventionally, a full data set is acquired, 3D Fourier transformed, and the magnitude of the complex result taken to render an image that is phase independent.

In traditional three dimensional imaging, the phase encode gradients might each vary in equal increments with 128 steps and 128 data points might be sampled in each view, defining a volume in k-space that is $128^3$ complex values. If each magnetic resonance excitation, phase encode, and echo sample sequence is repeated every 100 msec. and two repetitions of each encoding are averaged, a total scan time of almost an hour is required. With human patients, scan times of this duration are often undesirable. Moreover, long scan times limit three dimensional imaging to substantially motion-free areas of the anatomy, such as brain scans.

Various ways of reducing the scan time have been proposed. The repeat time cannot be reduced without loss of signal because it takes a finite time to regrow longitudinal magnetization between repetitions of the pulse sequence. Likewise, a reduction in echo time affects the image contrast. Scan time may be reduced by simply taking fewer steps in one of the phase encoding directions. This, however, may result in resolution loss and/or aliasing problems. One way to reduce the acquisition time is to define a thick slice in one of the phase encoding directions, then do the volume within this slice. Since there is effectively no object outside the slice, one can increase the spacing between phase encode views to reduce the number of views taken in the slice direction without affecting resolution. Unfortunately, because of imperfections in the slice definition, images from slices near the edges may not be acceptable.

Another method for reducing scan time is to increase the number of data points sampled per scan, such as the technique shown in U.S. Pat. No. 4,678,996. Others have reconstructed two dimensional images using only half a set of views, i.e. only the positive views or only the negative views.

The present invention provides a new and improved technique for reconstructing volumetric images with less than a full set of data and which compensates for the above referenced problems and others.

SUMMARY OF THE INVENTION

In accordance with the present invention, a method and apparatus are provided for magnetic resonance imaging. Magnetic resonance data is acquired along at least one complete data direction and one incomplete data direction. Symmetric data is generated from the acquired data using its complex conjugate symmetry properties. The symmetric data partially overlaps the actually acquired data in a central region midway along the incomplete direction. The acquired and symmetric data are filtered with complementary filters that are complementary along the incomplete direction at least in the central region. The filtered acquired and symmetric data are Fourier transformed to produce first and second arrays. The first and second arrays are phase corrected and combined.

In accordance with a more limited aspect of the invention, the phase corrections are derived from the acquired data in the central region.

In accordance with another more limited aspect of the invention, the acquired magnetic resonance data is generated utilizing a magnetic resonance sequence. Generating the symmetric data enables the number of repetitions of the sequence to be approximately halved. By doubling the time interval between sequences to allow more time for recovery of the longitudinal magnetization, the signal-to-noise ratio is improved.

In accordance with another more limited aspect of the invention, magnetic resonance data in the incomplete direction are phase encoded in steps which extend about twice as far in k space. In this manner, the resolution is about twice as great without increasing data acquisition time.

In accordance with another more limited aspect of the present invention, data along the partial data direction can be collected with steps about half as large extending the field of view to eliminate alias artifacts.

In accordance with another more limited aspect of the present invention, the magnetic resonance data is generated by sampling gradient echoes. However, just over half of each gradient echo is sampled, preferably starting just before the midway point of the echo and sampling toward a trailing end. This enables the echo delay time TE to be shortened. The echo can be sampled for a longer time with a lesser read gradient to improve the signal-to-noise ratio.

In accordance with the apparatus aspect of the invention, means are provided for performing each of the foregoing steps.

One advantage of the present invention is that it reduces data collection time.

Another advantage of the present invention resides in an improved signal-to-noise ratio.

Another advantage of the present invention is that it avoids aliasing along one of the phase encode directions without a time penalty.

A further advantage of the present invention resides in a reduction of artifacts and an improvement in resolution without a time penalty.

Still further advantages of the present invention will become apparent to those of ordinary skill in the art upon reading and understanding the following detailed description.

BRIEF DESCRIPTION OF THE DRAWINGS

The invention may take form in various steps and arrangements of steps and in various components and arrangements of components. The drawings are only for purposes of illustrating a preferred embodiment and are not to be construed as limiting, the invention.

FIGS. 1A and 1B are a two part diagrammatic illustration of a magnetic resonance imaging apparatus in accordance with the present invention;

DETAILED DESCRIPTION OF THE PREFERRED EMBODIMENT

Figure 1B:
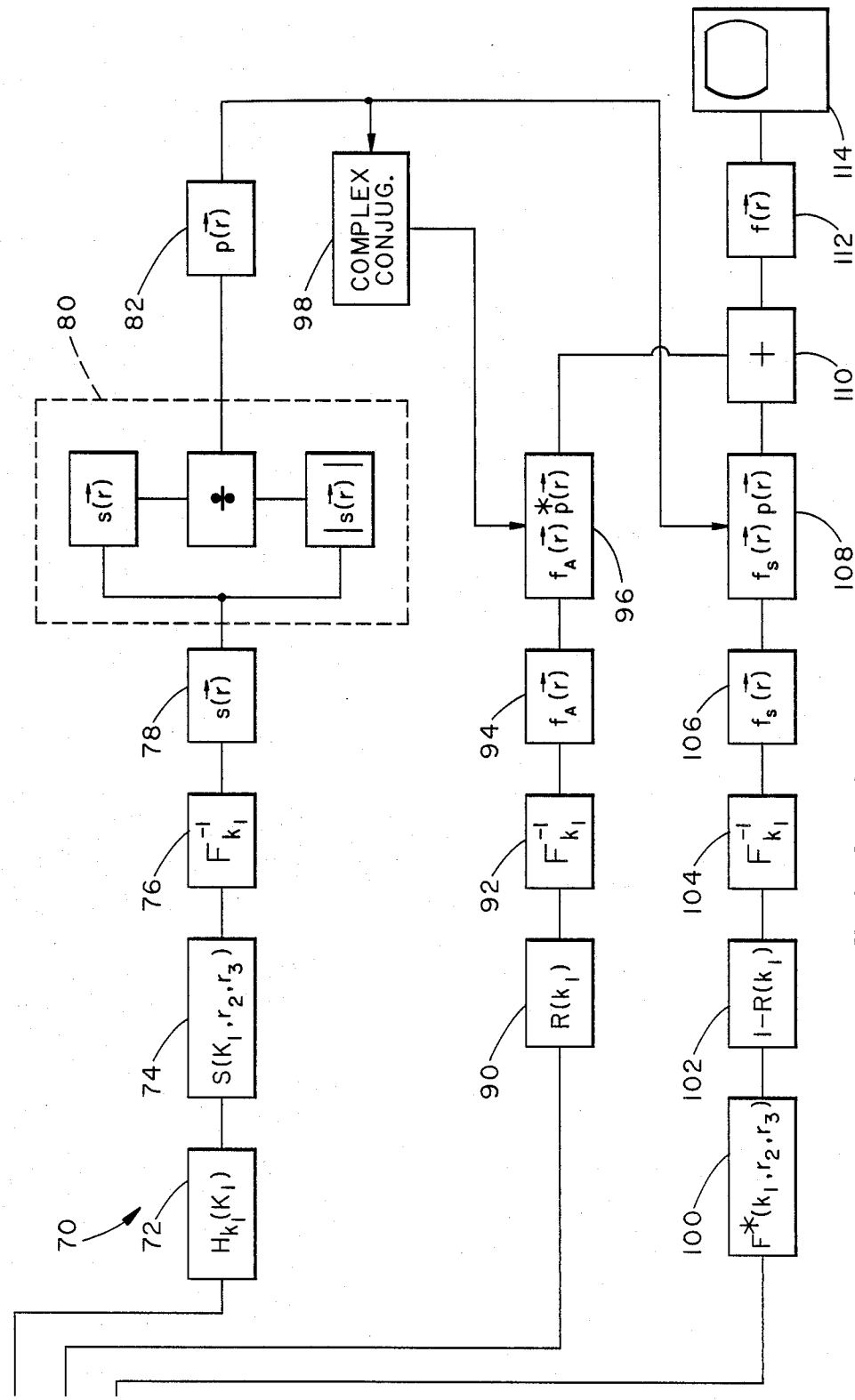

With reference to FIG. 1, a main magnetic field means, including a main magnetic field controller 10 and a plurality of electromagnets or superconducting magnets 12, generates a substantially uniform main magnetic field through an imaging or examination region. In a superconducting magnet, the controller 10 is used only to ramp up to field or down. A gradient field control means 20 selectively controls the application of gradient fields across the main magnetic field by gradient field coils 22. By selectively applying current to appropriate ones of the gradient field coils, gradients are selectively applied along three mutually orthogonal axes. Gradient fields in any direction can be produced by superposition of gradients along these axes. The center or zero of the image and data set corresponds to a point in space where no longitudinal field is produced by the gradient field coils.

A transmitter 30 selectively applies radio frequency pulses to RF coils 32 to excite nuclear spin of hydrogen in the imaging region to resonance and to manipulate the magnetization. Magnetic resonance signals generated by the resonating dipoles, particularly when the magnetization is refocused into an echo, are received by the RF coils 32. Optionally, a separate pick-up coil may be provided. A radio frequency quadrature receiver 34 quadrature detects and demodulates the received radio frequency signals to a selected bandwidth about a characteristic frequency. Preferably the characteristic frequency is zero. The real and imaginary parts of the quadrature detected magnetic resonance signals are digitized by a pair of analog-to-digital converters 36, 38. The digitized signal from each echo commonly being denoted as a view or line of data.

Figure 2:
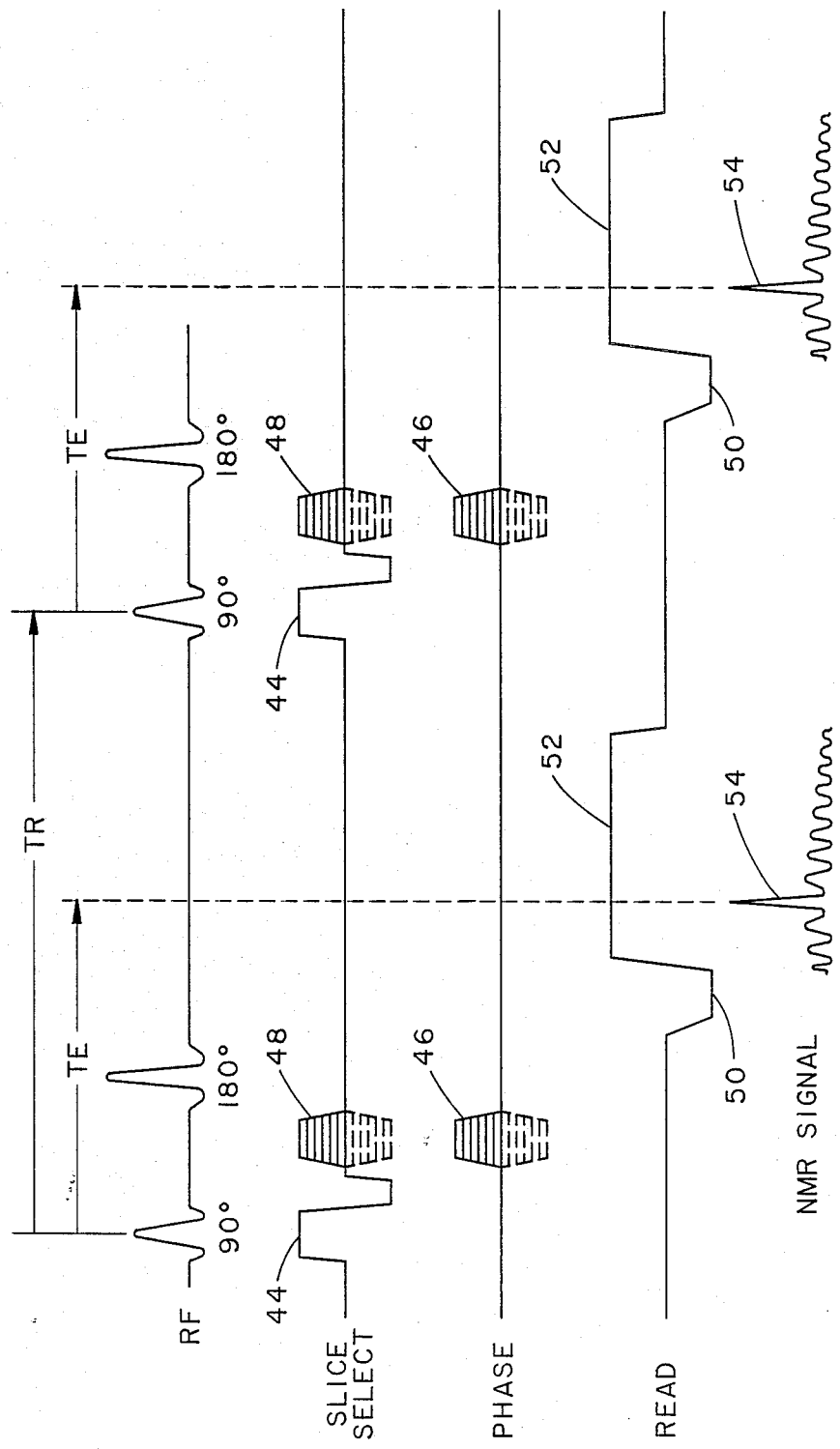
FIG. 2 is a timing diagram illustrating an exemplary pulse sequence for implementation by the apparatus of FIG. 1.

With reference to FIGS. 1A and 2, a timing and control means 40 controls the timing and application of the gradient and radio frequency profiles to perform three dimensional spin echo, gradient echo, inversion recovery, hybrid imaging, and other imaging sequences, as are well known in the art. For example, the sequence control means 40 may cause the transmitter 30 to apply a 90° RF pulse 42 concurrently with gradient field control 20 causing a first gradient profile 44 along a first or slice select direction. Thereafter, a first or primary phase encoding gradient 46 is applied on a second or phase encode direction and a second or secondary phase encoding gradient 48 is applied across one of the remaining direction, preferably the first or slice select direction. The phase encode gradients may each assume any one of a plurality of steps. Another gradient profile 50 is applied along a third or read gradient. A 180° RF refocusing pulse is applied to induce a spin echo 54. Another profile 52 is applied along the third or read gradient direction concurrently with the echo 54. Optionally, a gradient in the slice select direction may be applied concurrently with the refocusing pulse to define a slab.

The imaging sequence is repeated with the primary phase encode gradient stepping through each of its gradient steps while the secondary phase encoding gradient remains fixed in one of its steps. After the primary gradient has stepped through all or a selected position of its step, the secondary gradient is stepped to its next step. This sequence is repeated a plurality of times with the primary phase encoding gradient assuming each of its selected steps as the secondary gradient assumes each of its steps.

Figure 3:
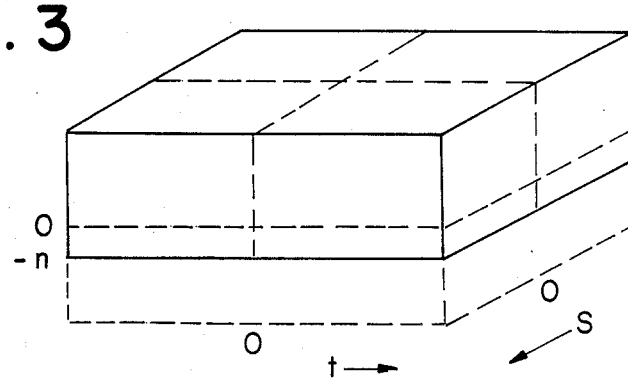
FIG. 3 is a graphic representation to assist in conceptualizing phase reflection to complete the volumetric data set.
Figure 4:
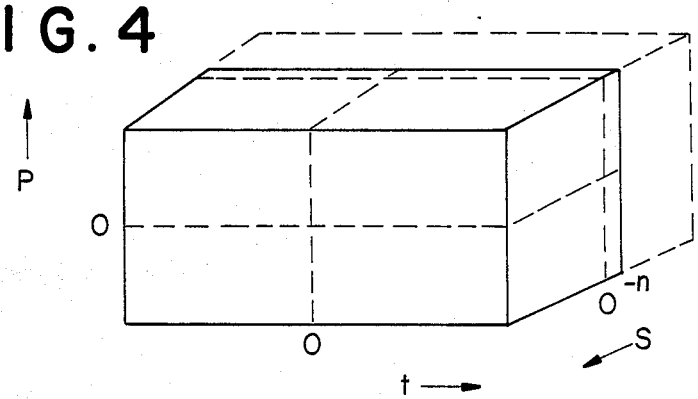
FIG. 4 is a graphic representation to assist in conceptualizing slice reflection to complete the data set; and, FIG. 5 is a graphic representation to assist in conceptualizing synthesizing additional views or slices by reflecting along the time axis.
Figure 5:
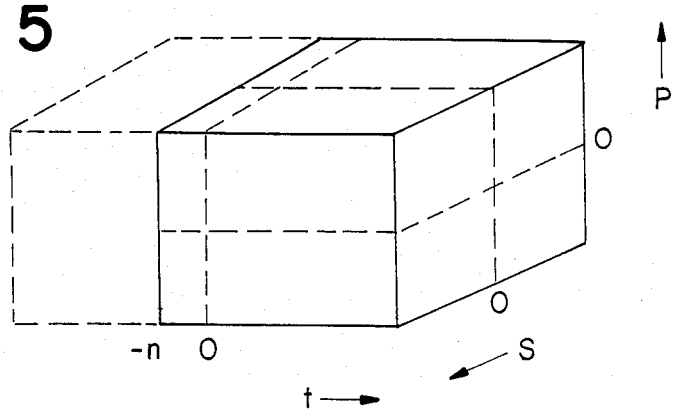

In the embodiment of FIG. 3, the imaging sequence is repeated with the primary phase encode gradient 46 assuming the steps from its positive maximum gradient through its zero or central phase encode gradient to a gradient step n steps to the negative. For example, the positive maximum phase encode gradient may be 128 steps from the zero or central phase encode gradient and n may be 16. Eliminating the time to collect the primary gradient steps from −17 through −128, cuts the data collection time nearly in half. Alternately, as shown in FIG. 4, the secondary phase encode gradient 48 along the slice select axis may be limited to one half of the total steps plus n steps. As illustrated in FIG. 5, the data along the time or read axis may be cut in half by sampling half plus n of the data points of the induced echo. That is, the echo may be sampled from n points before its midpoint toward the trailing end. This allows the echo time TE to be shortened such that the echo midpoint is about n points from the leading edge of the real gradient. As yet another alternative, a phase encode gradient may also be applied along the read gradient axis to create a four dimensional image. More specifically, three dimensions of spatial information and one dimension of frequency, such as chemical shift, information can be recovered.

The real and imaginary parts of the digital values of the partial or fractional data sets as described above in conjunction with FIGS. 3, 4, and 5 or combinations thereof, are stored in a data memory 60. A centering means 62 centers the data. For spin echo or gradient echo imaging, the magnitude of the acquired data has a maximum at the center of the data set, i.e. the datum value acquired with the zero or minimum phase encoding along all phase encoding directions and at the characteristic or center frequency. The data within the data memory 60 is shifted such that the largest data value is moved to the center of the data acquisition memory. Of course, other centering options may also be implemented A first, one dimensional Fourier transform means 64 performs a one dimensional, inverse Fourier transform along one of the directions that has the same number of data points to either side of zero. In the illustrated three dimensional embodiment, one of the two complete data directions, e.g. $k_3$, is selected. A second one dimensional inverse Fourier transform means 66 performs an inverse one dimensional Fourier transform along another complete data direction, e.g. $k_2$. The Fourier transformed data is stored in an intermediate data memory 68.

With reference to FIG. 18, a phase map reconstruction means 70 reconstructs a phase correction array or map from the data in the neighborhood of zero, i.e. the data along the partial data direction $k_1$ between $\pm n$, in the illustrated example. To complete the data in the partial data direction $k_1$, data values to either side of the original, centered data are set to zero. A roll-off filter means 72, such as a Hanning filter $H(k_1)$ rolls off the data values along the partial data direction. The filter generates a filtered data set $S(k_1, r_2, r_3)$ for storage in a filtered data latch or memory means 74 in which the selected data in the neighborhood of zero has a smooth transition to zero. That is:

$$S(k_1, r_2, r_3) = H(k_1) \cdot F(k_1, r_2, r_3) \quad (1),$$

for $-n-1 \leq k_1 \leq n$.

The first two transforms 64 and 66 were done using all of the data in the two complete data directions and the off filter means leaves only the data around the center in the incomplete direction. Various other roll-off filters may be utilized to provide the smooth transition between the collected data and the surrounding zeros to eliminate any discontinuities which might cause ringing or artifacts.

A one dimensional inverse Fourier transform means 76 performs a one dimensional, inverse Fourier transform with respect to the incomplete data direction $k_1$. Although a three dimensional phase map can be generated, a large amount of storage would be required. A $256 \times 256 \times 256$ three dimensional phase map of the preferred embodiment would have 16.8 million complex data points. Assume that the data in memory 60 has the dimensions $R_1 \times R_2 \times R_3$ or has been zero padded out to these dimensions. Thus, $R_1$, $R_2$, $R_3$ indicate the number of data samples in the $r_1$, $r_2$, $r_3$ directions respectively. The first Fourier transform means 64 picks up $R_3$ of these samples from the data memory 60, a total of $R_1 \times R_2$ times. If the Fourier transform is done on each vector of $R_3$ complex points then they can be written to the memory locations they originated from in the data memory 60. The same is true for Fourier transform means 66 except it picks up $R_2$ points at a time to process them. If $R_1$, $R_2$, $R_3$ are 128, 256, and 512 then means 64 does 32768 transforms of lengths 512. Also the second Fourier transform means 66 does 65536 transforms of length 256. These data can be written into the memory locations they were read from. Thus, memory means 68 can be the same as memory means 60.

Getting from memory means 68 to image memory means 112 is another problem. However, it is still a one dimensional problem as is Fourier transform means 64 and 66. This time we pick up the data points in the $k_1$ direction then using these points to steps 72→82, 90→96, 100→108 with the appropriate combination scheme to get to step 112. Finally, these $R_1$ or 128 points are written into image memory 112 which in principle could be the same data memory as 60 and 68, although in practice is usually an image file. Remember that We went through the processing steps between 68 and 112 a total of $R_2 \times R_3$ times or 131072 times, once for each group of $R_1$ or 128 points that is written to image memory 112. The trick here is to have the three pipelines, proceed in parallel for each group of points picked up in the $k_1$ direction. This saves 16.8 complex megawords of memory that would otherwise be needed for the phase map.

To reduce the required memory, the inverse Fourier transform means 76 generates a plurality of one dimensional phase correction vectors which are stored in a phase correction memory means 78. In a $256 \times 256 \times 256$ embodiment, the Fourier transform means 76 performs about sixty five thousand ($256 \times 256$) transforms each of length 256. Each $1 \times 256$ phase map direction is described by the equation:

$$s(r) = F^{-1}\{S(k_1, r_2, r_3)\} \quad (2).$$

A phase map correction determining means 80 determines an appropriate correction for each point $s(r)$. The correction array $p(r)$ are each stored in a phase correction memory means 82. In the preferred embodiment, the phase correction $p(r)$ is the Fourier transformed array of unit value, i.e.

$$p(r) = \frac{s(r)}{|s(r)|} \quad (3)$$

Although this correction is technically not a phase map, it is the functional equivalent of a phase map. Conventionally, a phase map is the arctangent of the ratio of the real and imaginary parts of the array $s(r)$, i.e.

$$\phi(r) = \text{Arctan}\left\{\frac{Im(s(r))}{Re(s(r))}\right\} \quad (4)$$

The arctangent phase map may also be used where $p(r) = e^{i\phi(r)}$.

The processed collected data from the intermediate data memory means 68 is filtered with a roll-off filter 90, such as a Hanning filter $R(k_1)$, to ramp down toward zero the n data points at the center of the intermediate memory. An inverse Fourier transform means 92 transforms the filtered data with respect to the incomplete data direction, e.g. $k_1$, to create a filtered array or first complex image representation $f_A(r)$ which is stored in a first array memory means 94. Although a three dimensional complex image representation can be created and stored in the first array memory means 94, it is preferred that the Fourier transform means 92 transform individual one dimensional arrays of the filtered data. In the illustrated 256×256×256 example, about sixty-five thousand (128×256) arrays which are each 256 elements in length are serially transformed. That is:

$$f_A(r) = F^{-1}\{F(k_1, r_2, r_3) \cdot R(k_1)\} \quad (5).$$

A first phase correction means 96 phase corrects each vector of the first complex image representation $f_A$ in accordance with the phase information of the corresponding correction vector from the phase memory means 82. More specifically, a phase correction complex conjugate means 98 calculates the complex conjugate of each value of the phase memory 82. For example, the complex conjugate of a unit vector $e^{i\phi(r)}$ is $e^{-i\phi(r)}$. The phase correction means 96 multiplies each vector of the complex image representation $f_A(r)$ by the complex conjugate of the value $p^*(r)$ of the vector from the phase memory means 82. The resultant phase corrected first complex image representation is then of the form:

$$f_A(r) p^*(r) \quad (6).$$

A symmetric data means 100 generates a symmetric data set which is a complex conjugate of the processed collected data values of memory means 68. In the preferred embodiment, data along the $k_1$ direction is collected from $-n$ to $+128$. The symmetric data set is determined from the relation $F(-k_1, r_2, r_3) = F^*(k_1, r_2, r_3)$ and includes data from 0 to $-128$. A complimentary roll-off filter means 102 ramps the symmetrized data with a filter function $1 - R(k_1)$ that is the complement of the first roll-off filter $R(k_1)$. A Fourier transform means 104 performs an inverse, one dimensional Fourier transform on the filtered third data set to create a second complex image representation or symmetric array $f_s(r)$ for storage in a second image representation memory means 106. Again, the Fourier transform means in the preferred embodiment performs each of about sixty-five thousand (256×256) transforms. That is:

$$f_s(r) = f^{-1}\{F^*(k_1, r_2, r_3) \cdot (1 - R(k_1))\} \quad (7).$$

A second phase correction means 108 corrects each data value of the vectors of the second image representation or array $f_s$ in accordance with the corresponding phase correction vector from the phase memory 82. In the preferred embodiment, the second phase corrected complex image representation is of the form:

$$f_s(r) p(r) \quad (8).$$

In this manner, the first and second phase correction means 96, 108 perform a phase correction in which the resultant data or image representation is corrected with a phase map or the equivalent of a phase map generated from the same data. Utilizing the same data to correct the phase protects against the introduction of phase errors which might arise if different data were utilized, such as a calibration scan that might be used to collect data for a phase map. It is to be appreciated, however, that deriving the phase map or the equivalent from a calibration scan will find useful application in conjunction with the present invention.

An adding means 110 sums the phase corrected first and second complex image representations. More specifically to the preferred embodiment, the adding means sums each phase corrected vector of the filtered array and the symmetrized array and stores the sum as one line of an image in a resultant image memory means 112. The resultant image is, of course, a three dimensional complex image in which each data value is a complex number having a real part and an imaginary part. That is:

$$f(r) = f_a p^*(r) + f_s(r) p(r) \quad (9).$$

A display means 114 is operatively connected with the resultant image memory means 112. The display means may display the real component, the imaginary component, or combinations thereof. Moreover, selected slices, planes, projections of tortuous slices or paths, and the like may be displayed. The slices may be planes orthogonal to the slice select, read, and phase encode directions or may be at selected angles relative to one or more of these directions, may be multisegmental with several angular jogs, curved surfaces, or the like. The planes may follow a selected contour which jogs and curves, such as a slice or path which skirts a selected organ, or a slice or path that follows the interface between two tissues. Other data storage means, image enhancement circuitry, and the like may be interconnected with the resultant image memory means 112.

The phase corrected conjugate symmetry technique can be adapted to improve imaging speed, signal-to-noise ratio, and reduce aliasing. Regarding speed reduction, large matrices of data of necessity have a relatively long data acquisition time. For example, to acquire data for a 128×128×128 volume conventionally with a repeat time of 50 msec and two repetitions per view, requires over 27 minutes. To increase the resolution in each direction to 256 intervals would increase the acquisition time by a factor of eight. Because the present phase corrected conjugate symmetry technique requires the acquisition of only a little over half the data, the data acquisition time can be reduced almost in half.

Analogously, the signal-to-noise ratio can be improved by increasing the sequence repeat time (TR). In the above example, the signal repeat time can be increased from 50 msec to about 100 msec without increasing the total scan time. That is, the time between excitations is increased by about 50 msec. The magnitude of the collected signal is proportional to:

$$1 - \exp(-TR/T1) \quad (10),$$

where T1 for brain tissue is about 700 msec. For a sequence repeat time of 50 msec, the signal amplitude is proportional to 0.07; whereas for a repeat time of 100 msec, the amplitude is proportional to 0.133. Thus, doubling the sequence repeat time improves the signal strength by 90% and the signal-to-noise ratio by 1.9/1.412 or 34%.

The present technique provides for increased sequence flexibility such as the ability to use asymmetric sampling and extended sampling to achieve images with shorter echo delay times (TE). Because only slightly over half of a resultant echo need be monitored, the echo can be shifted closer to the beginning of the sequence. This shortens the length of each sequence, improving imaging speed. Alternately, the signal-to-noise ratio can be improved by sampling the half echo for a longer period of time with a reduced gradient 50 and RF band pass filter.

This method may be used with isotropic or anisotropic matrices to reduce aliasing without increasing acquisition time. In the prior art, it was necessary to over-sample in the frequency encoding direction to avoid aliasing from a sample that extended beyond the imaged field of view. In the phase encode direction, over-sampling increased acquisition time by the over-sampling factor. Accordingly, the phase encoding axis was normally chosen such that the object did not extend beyond the field of view. For example, in sagittal imaging, the long axis z was chosen as the read axis and the y axis for phase encoding. However, in volume imaging in which there is two phase encoding directions, it is not always possible to select two axes in which the object does not extend beyond the field of view. Aliasing can be prevented along one of the two phase encoded axes by utilizing the present invention to double the effective number of views, i.e. by over-sampling. Actually acquiring data for just over half of the doubled number of views and symmetrizing the remaining views reduces aliasing without a time penalty.

The technique can also be used to improve slice resolution. In a slab imaging technique, an anisotropic data set is collected with a reduced number of data points in the "slice" direction. This creates a three-dimensional set of data in which the slice or slab direction is smaller than the other dimensions. The width of the smaller or slab dimension is defined by selective excitation. The slab is divided into a set of thinner slices by secondary phase encoding in the slice direction. The number of slices to which the slab is subdivided is proportional to the number of phase encoding steps. Conjugate symmetrization can be used either to increase the slice resolution within the slab or the number of acquired slices without an acquisition time penalty. Exciting a wider slab with more slices in the same total scan time extends the patient coverage to avoid artifacts that occur near the edges of the slab due to imperfect selective excitation. Alternatively, the resolution of a prior art 16 slice slab can be doubled to 32 slices with no significant time penalty by collecting actual data for just over half the slices and generating the remaining data by symmetrization.

The invention has been described with reference to the preferred embodiments. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiments, the invention is now claimed to be:

1. A method of magnetic resonance imaging comprising:
    (a) exciting magnetic resonance of selected dipoles in an image region;
    (b) after excitation of magnetic resonance, causing a magnetic resonance echo;
    (c) during each magnetic resonance echo, sampling a view;
    (d) phase encoding the magnetic resonance in at least two directions, the phase encoding includes applying first and second phase encode gradients that vary in steps such that each sampled view is phase encoded along the two directions in accordance with the phase encode gradient steps;
    (e) repeating steps (a), (b), (c), and (d) with each of a plurality of phase encode gradient steps along a first of the directions centered around a central phase encode gradient step and a second of the gradients varying in steps with each repetition from a maximum negative phase encode step to a maximum positive phase encode step;
    (f) repeating steps (a), (b), (c), and (d) with each of plurality of phase encode gradient steps along the first directions extending between the central views and a view corresponding to one of the positive and negative maximum phase encode gradient steps to acquire actually sampled views;
    (g) generating a phase correction array from the central phase encoded views;
    (h) generating a set of synthesized views corresponding to non-sampled views between the central views and a view corresponding to the other of the maximum positive and negative phase encode gradient step along the first direction;
    (i) Fourier transforming the central and the actually sampled views to form a first image representation;
    (j) determining complex conjugate values from the phase correction array and correcting each data value of the first image representation with the complex conjugate of the corresponding value of the phase correction array to create a phase corrected first image representation;
    (k) Fourier transforming the synthesized views to create a second image representation;
    (l) phase correcting the second image representation in accordance with the corresponding values from the phase correction array; and,
    (m) combining the first and second phase corrected image representations.

2. The method as set forth in claim 1 further including after step (f) performing the steps of:
    performing a one dimensional Fourier transform with respect to the second direction and a one dimensional Fourier transform with respect to a third direction to form an intermediate data set;
    wherein in step (g), the phase correction array is generated by performing a one dimensional Fourier transform with respect to the first axis on the views; and,
    wherein in steps (i) and (k), the Fourier transformings are one dimensional Fourier transform with respect to the first direction; and,
    wherein in step (h), the generation of synthesized views includes determining complex conjugates of the actually sampled views.

3. A method of magnetic resonance imaging comprising:
    generating actually acquired data along at least a first direction and a second direction;
    deriving symmetric data from the actually acquired data using complex conjugate symmetry properties thereof such that the symmetric data partially overlaps the actually acquired data in a central region with respect to one of the first and second directions;

deriving an array of phase correction values from data in the central region;

Fourier transforming the actually acquired data to generate a first array;

Fourier transforming the symmetric data to form a second array;

phase correcting the first and second arrays in accordance with the phase correction array; and, combining the phase corrected first and second arrays.

4. The method as set forth in claim 3 further including:

before Fourier transforming the actually acquired data, operating on the actually acquired data with a first roll-off filter; and, prior to Fourier transforming the symmetric data, operating on the second symmetric data with a second roll-off filter, the second roll-off filter being complementary to the first roll-off filter in the central region.

5. The method as set forth in claim 4 wherein the step of deriving the phase correction array includes:

operating on the actually acquired data in the central region with roll-off filters;

Fourier transforming the roll-off filtered actually acquired data from the central region.

6. The method as set forth in claim 5 wherein the step of deriving the phase correction array further includes normalizing the roll-off filtered Fourier transformed actually acquired data to derive the phase correction array.

7. The method as set forth in claim 3 wherein the step of generating actually acquired data includes generating actually acquired data along a third direction such that a three dimensional set of actually acquired data is generated.

8. The method as set forth in claim 7 wherein:

in the step of Fourier transforming the actually acquired data, the data is transformed in one dimensional arrays or vectors;

in the step of Fourier transforming the symmetric data, the symmetric data is transformed in one dimensional arrays or vectors;

in the phase correcting step, the vectors are each phase corrected; and, in the combining step, the phase corrected, Fourier transformed actually acquired and symmetric data vectors are combined to produce lines of a three dimensional image representation.

9. The method as set forth in claim 3 wherein the step of generating actually acquired data includes:

causing a magnetic resonance echo;

sampling the echo between generally a center of the echo and a trailing end thereof to generate the data along the first direction, whereby echo delay time can be shortened to shorten data acquisition time without increasing a signal-to-noise ratio or the echo can be sampled further towards the trailing edge to improve the signal-to-noise ratio without increasing the data acquisition time.

10. The method as set forth in claim 7 wherein the step of generating the actually acquired data includes:

collecting a reduced number of data points along the first direction such that the three dimensional data set is a thick slice or slab;

applying a secondary phase encoding in steps in the first direction such that the slab is divided into a number of slices corresponding to the number of phase encoding steps, whereby symmetrizing the data can increase slice resolution within the slab or can enable more slices to be taken over a thicker slab so as to get larger coverage before encountering end artifacts without increasing data acquisition time.

11. A method of magnetic resonance imaging comprising:

acquiring an acquired data set which is complete with respect to at least one direction and incomplete with respect to another direction, the data set being at least substantially half complete with respect to the another direction;

inverse Fourier transforming the acquired data set with respect to the at least one complete data direction to create an intermediate data set;

determining a symmetric data set which is related to the intermediate data set by complex conjugate symmetry;

filtering the acquired and symmetric data sets with complementary filters;

Fourier transforming the filtered intermediate and symmetric data sets; and, phase correcting the Fourier transformed, filtered intermediate and symmetric data.

12. The method as set forth in claim 11 further including deriving a phase correction array from one of the acquired and intermediate data sets and wherein the phase correcting step includes correcting the Fourier transformed, filtered intermediate and symmetric data in accordance with a corresponding value of the phase correction array.

13. A method of magnetic resonance imaging comprising:

acquiring an acquired data set which is complete with respect to at least a first direction and a second direction and which is incomplete with respect to a third direction, the acquired data being at least substantially half complete with respect to the third direction;

inverse Fourier transforming the acquired data with respect to the first and second directions to create intermediate data;

determining symmetric data which is related to the intermediate data by complex conjugate symmetry;

Fourier transforming the intermediate and conjugate symmetry data;

phase correcting the Fourier transformed intermediate and conjugately symmetry data;

combining the phase corrected, Fourier transformed intermediate and conjugate symmetry data.

14. A magnetic resonance imaging apparatus comprising:

a magnetic resonance data means for generating magnetic resonance data which is complete with respect to at least one direction and incomplete with respect to another direction;

a symmetry means for generating symmetric data from the magnetic resonance data using a complex conjugate symmetry property thereof such that the symmetric data partially overlaps the magnetic resonance data in a central region;

a Fourier transform means for transforming the magnetic resonance and symmetric data with respect to the incomplete direction to create first and second arrays;

a phase correction means for correcting the first and second arrays; and, a combining means for combining the phase corrected, transformed first and second arrays to create a resultant image representation.

15. The apparatus as set forth in claim 14 further including a phase correction array generating means for generating a phase correction array, the phase correction means being operatively connected with the phase correction array generating means for correcting the first and second arrays in accordance with a generated phase correction array.

16. The apparatus as set forth in claim 15 wherein the phase correction array generating means includes a Fourier transform means for transforming magnetic resonance data from the central region.

17. The apparatus as set forth in claim 16 wherein the magnetic resonance data generating means includes:

a means for exciting magnetic resonance of dipoles in an image region;

a means for inducing magnetic resonance echoes during which magnetic resonance echo signals are sampled;

a gradient means for selectively applying magnetic field gradients across the image region for phase encoding the magnetic resonance signals; and, an analog-to-digital converter for digitizing the sampled magnetic resonance echo signals to generate the magnetic resonance data.

18. The apparatus as set forth in claim 14 further including complementary roll-off filters operatively connected with the Fourier transform means for filtering the magnetic resonance and symmetric data with complementary roll-off filters before the magnetic resonance data is Fourier transformed by the Fourier transform means.

19. A magnetic resonance imaging apparatus comprising:

a magnetic resonance data means for generating acquired magnetic resonance data which is complete with respect to first and second axis and incomplete with respect to a third axis;

a phase correction generating means for generating phase correction values, the phase correction generating means being operatively connected with the magnetic resonance data means;

a symmetry means for generating symmetric data which is symmetric to the acquired magnetic resonance data, the symmetry means being operatively connected with the magnetic resonance data means;

a Fourier transform means for transforming the magnetic resonance and symmetric data to create first and second arrays;

a phase correcting means for phase correcting the first and second partial image representations in accordance with the phase correction values; and, a combining means for combining the phase corrected first and second partial image representations to create a resultant image representation.

20. The apparatus as set forth in claim 19 further including complementary roll-off filter means operatively connected with the Fourier transform means for filtering the magnetic resonance and symmetric data with complementary filters, the filter means being operatively connected with the magnetic resonance data means and the symmetry means for receiving acquired and symmetric data therefrom and with the Fourier transform means for supplying filtered acquired data and symmetric data thereto.

* * * * *